(12) United States Patent
Nakao et al.

(10) Patent No.: US 10,153,164 B2
(45) Date of Patent: Dec. 11, 2018

(54) METHOD FOR MANUFACTURING SEMICONDUCTOR DEVICE

(71) Applicant: TOSHIBA MEMORY CORPORATION, Tokyo (JP)

(72) Inventors: Shinichi Nakao, Yokkaichi Mie (JP); Shunsuke Ochiai, Yokkaichi Mie (JP); Yusuke Oshiki, Kuwana Mie (JP); Kei Watanabe, Yoakkaichi Mie (JP); Mitsuhiro Omura, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/661,252

(22) Filed: Jul. 27, 2017

(65) Prior Publication Data

US 2018/0166276 A1   Jun. 14, 2018

(30) Foreign Application Priority Data

Dec. 9, 2016 (JP) .................................. 2016-239278

(51) Int. Cl.
*H01L 21/033* (2006.01)
*H01L 21/311* (2006.01)
(Continued)

(52) U.S. Cl.
CPC ........ *H01L 21/0332* (2013.01); *H01L 21/033* (2013.01); *H01L 21/0335* (2013.01); *H01L 21/0337* (2013.01); *H01L 21/3065* (2013.01); *H01L 21/311* (2013.01); *H01L 21/31116* (2013.01); *H01L 21/31144* (2013.01); *H01L 21/768* (2013.01); *H01L 21/76802* (2013.01); *H01L 21/76877* (2013.01); *H01L 27/115* (2013.01); *H01L 29/788* (2013.01);
(Continued)

(58) Field of Classification Search
CPC ........... H01L 21/76816; H01L 21/3081; H01L 21/3065; H01L 23/5226; H01L 21/76877; H01L 27/1157; H01L 21/0337; H01L 21/0335; H01L 21/0332; H01L 21/76802; H01L 27/11582; H01L 21/31116; H01L 21/31144; H01L 23/528
See application file for complete search history.

(56) References Cited

U.S. PATENT DOCUMENTS 6,287,975 B1   9/2001 Deornellas et al.
7,767,367 B2   8/2010 Yoshikawa et al.
(Continued)

*Primary Examiner* — Jasmine Clark
(74) *Attorney, Agent, or Firm* — Foley & Lardner LLP

(57) ABSTRACT

A method for manufacturing a semiconductor device includes forming a mask layer including a) one metal from tungsten, tantalum, zirconium, hafnium, molybdenum, niobium, ruthenium, osmium, rhenium, and iridium, b) boron, and c) carbon on a layer to be etched. The mask layer is patterned. A hole or a groove is formed in the layer to be etched by performing dry etching on the layer to be etched using the patterned mask layer. The mask layer includes a first region and a second region. The first region includes boron and the second region includes boron such that a density of boron in the second region is different from a density of boron in the first region, or the first region includes carbon and the second region includes carbon such that a density of carbon in the second region is different from a density of carbon in the first region.

20 Claims, 14 Drawing Sheets

(51) Int. Cl.

| | |
|---|---|
| *H01L 21/768* | (2006.01) |
| *H01L 21/3065* | (2006.01) |
| *H01L 29/788* | (2006.01) |
| *H01L 29/792* | (2006.01) |
| *H01L 27/115* | (2017.01) |
| *H01L 27/1157* | (2017.01) |
| *H01L 27/11582* | (2017.01) |

(52) U.S. Cl.
CPC ........ *H01L 29/792* (2013.01); *H01L 27/1157* (2013.01); *H01L 27/11582* (2013.01)

(56) References Cited

U.S. PATENT DOCUMENTS

| | | | |
|---|---|---|---|
| 9,620,366 B2 * | 4/2017 | Nakao | ............... H01L 27/11582 |
| 9,754,793 B2 * | 9/2017 | Nakao | ................. H01L 21/3065 |
| 2002/0038681 A1 | 4/2002 | Nakatani et al. | |
| 2016/0365249 A1 | 12/2016 | Nakao et al. | |

* cited by examiner 81a  81b  81c  81d

METHOD FOR MANUFACTURING SEMICONDUCTOR DEVICE

CROSS-REFERENCE TO RELATED APPLICATION

This application claims the benefit of and priority to Japanese Patent Application No. 2016-239278, filed Dec. 9, 2016, the entire contents of which are incorporated herein by reference.

FIELD

Embodiments described herein relate generally to a method for manufacturing a semiconductor device.

BACKGROUND

For example, in a method for manufacturing a three-dimensional memory cell array, while a technique to form holes in a stacked body in which different types of materials are alternately stacked in layers is required, when the number of stacked layers increases to achieve a high bit density and the stacked body becomes thicker, the formation of holes with a high aspect ratio may be required. With regard to etching for forming holes with a high aspect ratio, the amount of etching of a mask also increases, so that the mask shape is likely to deteriorate. The deterioration of the mask shape may affect the shape or dimension of a hole formed in the stacked body.

DETAILED DESCRIPTION

Figure 1:
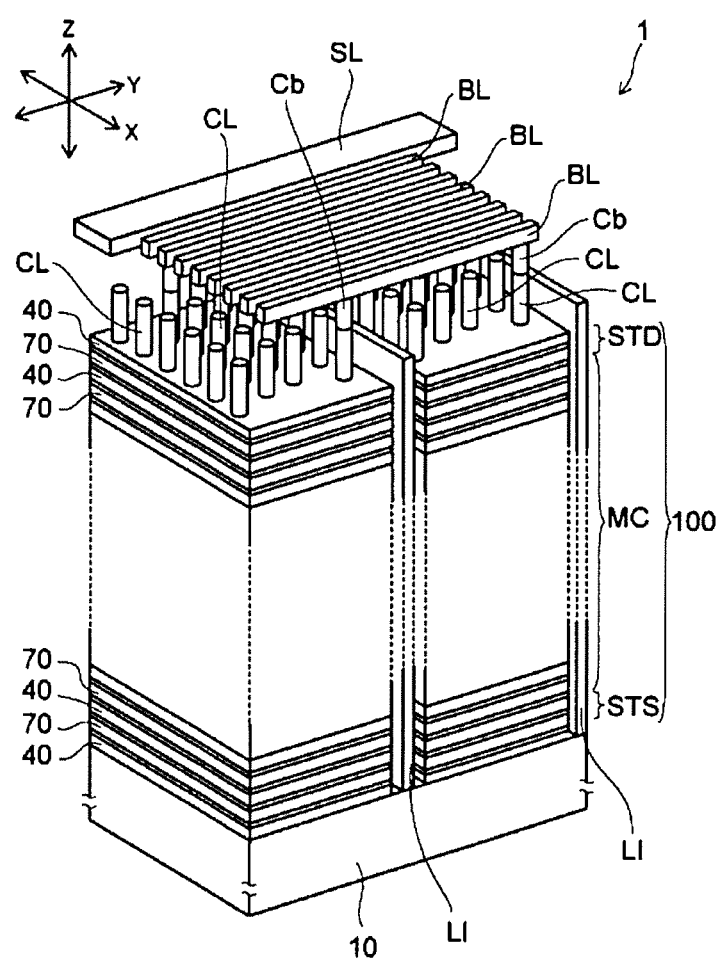
FIG. 1 is a schematic perspective view of a semiconductor device according to some embodiments.

An example embodiment provides a method for manufacturing a semiconductor device which is suitable for etching for holes or slits with a high aspect ratio.

In general, according to some embodiments, a method for manufacturing a semiconductor device includes forming a mask layer containing one of metals including tungsten, tantalum, zirconium, hafnium, molybdenum, niobium, ruthenium, osmium, rhenium, and iridium, boron, or carbon on a layer to be etched, patterning the mask layer, and forming a hole or a groove in the layer to be etched by performing dry etching on the layer to be etched using the patterned mask layer, wherein the mask layer has a first region containing the boron or the carbon and a second region in which a density of the boron or the carbon is different from that in the first region. In some embodiments, the first region contains boron and the second region contains boron such that a density of boron in the second region is different from a density of boron in the first region, or the first region contains carbon and the second region contains carbon such that a density of carbon in the second region is different from a density of carbon in the first region.

Hereinafter, embodiments are described with reference to the drawings. Furthermore, in the drawings, the same elements are assigned the respective same reference characters.

A semiconductor device according to some embodiments is a semiconductor memory device.

FIG. 1 is a schematic perspective view of a memory cell array 1 in the semiconductor memory device according to some embodiments.

In FIG. 1, two directions which are parallel to the principal surface of a substrate 10 and are orthogonal to each other are referred to as an "X-direction" and a "Y-direction", and a direction which is orthogonal to both the X-direction and the Y-direction is referred to as a "Z-direction (stacking direction)".

In some embodiments, the memory cell array 1 includes the substrate 10, a stacked body 100 provided on the principal surface of the substrate 10, a plurality of columnar portions CL, a conductive material LI, and an upper layer wiring provided on the stacked body 100. In FIG. 1, bit lines BL and a source layer SL are illustrated as the upper layer wiring.

In some embodiments, the columnar portion CL is formed in the shape of a column or an elliptic column extending in the stacking direction (or Z-direction) inside the stacked body 100. In some embodiments, the conductive material LI extends in the stacking direction (or Z-direction) of the stacked body 100 and in the X-direction between the upper layer wiring and the substrate 10, thus dividing the stacked body 100 in the Y-direction.

The plurality of columnar portions CL are arranged, for example, in a staggered manner. In some embodiments, the plurality of columnar portions CL can be arranged in a square lattice manner along the X-direction and the Y-direction.

In some embodiments, a plurality of bit lines (for example, metal films) BL is provided on the stacked body 100. In some embodiments, the plurality of bit lines BL are separated from each other in the X-direction, and each bit line BL extends in the Y-direction.

In some embodiments, the upper end of the columnar portion CL is connected to the bit line BL via a contact portion Cb. In some embodiments, a plurality of columnar portions CL selected one by one from regions (or blocks) separated in the Y-direction by the conductive material LI are connected to one bit line BL in common.

Figure 2:
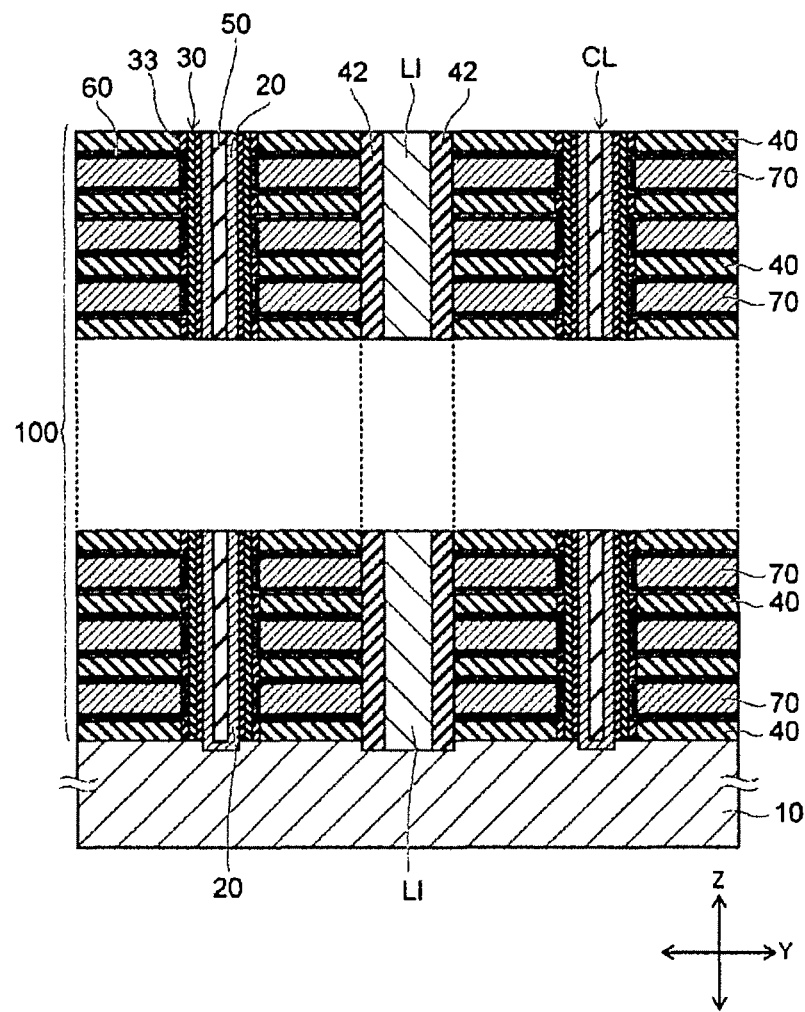
FIG. 2 is a schematic sectional view of the semiconductor device according to some embodiments.

FIG. 2 is a schematic sectional view of the stacked body 100, the columnar portion CL, and the conductive material LI. FIG. 2 illustrates a cross section which is parallel to the Y-Z plane in FIG. 1.

In some embodiments, the stacked body 100 includes a plurality of conductive layers 70 and a plurality of insulating layers 40 which are stacked in layers on the principal surface of the substrate 10. In some embodiments, the plurality of conductive layers 70 are stacked in layers in the Z-direction at a predetermined periodicity via each insulating layer 40.

In some embodiments, the conductive layer 70 may be a metal layer containing at least one of tungsten (W) and molybdenum (Mo). For example, the conductive layer 70 is a tungsten layer which contains tungsten as a major component or a molybdenum layer which contains molybdenum as a major component. The insulating layer 40 contains, for example, oxide silicon ($SiO_2$) as a major component.

Figure 3:
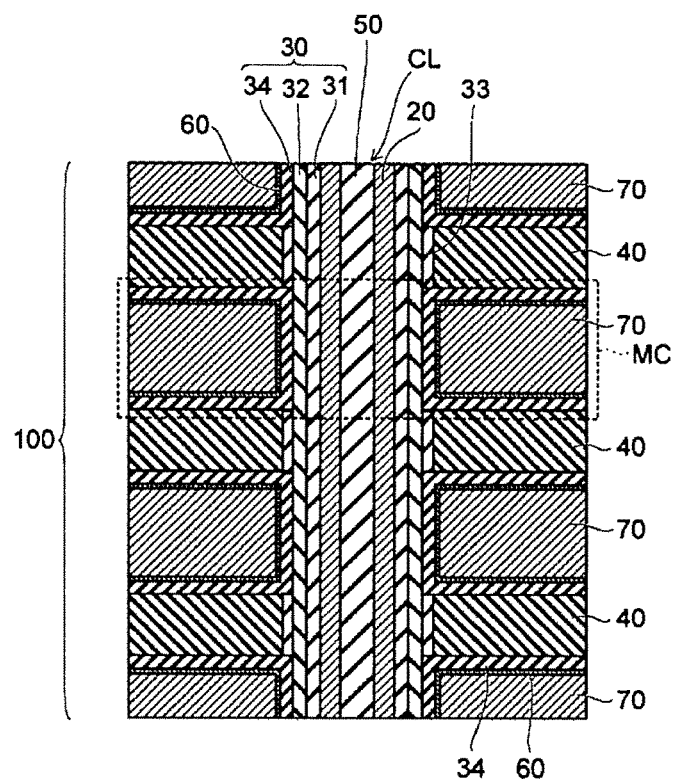
FIG. 3 is an enlarged sectional view of a portion in FIG. 2.

FIG. 3 is an enlarged sectional view of a portion in FIG. 2.

In some embodiments, the columnar portion CL includes a memory film 30, a semiconductor film 20, and an insulating core film 50. In some embodiments, the semiconductor film 20 may extend in a pipe-like shape in the stacking direction (or Z-direction) inside the stacked body 100. In some embodiments, the memory film 30 is provided between the conductive layer 70 and the semiconductor film 20 and surrounds the semiconductor film 20 from the outer periphery side thereof. In some embodiments, the core film 50 is provided at the inner side of the semiconductor film 20, which is in a pipe-like shape.

In some embodiments, the upper end of the semiconductor film 20 may be electrically connected to the bit line BL via the contact portion Cb illustrated in FIG. 1.

In some embodiments, the memory film 30 includes a tunnel insulating film 31, which serves as a first insulating film, a charge storage film 32, and a block insulating film 34, which serves as a second insulating film. In some embodiments, the charge storage film 32, the tunnel insulating film 31, and the semiconductor film 20 extend in a successive manner in the stacking direction of the stacked body 100. In some embodiments, the charge storage film 32, the tunnel insulating film 31, and the semiconductor film 20 are provided in this order in the Y-direction. In some embodiments, the block insulating film 34, the charge storage film 32, and the tunnel insulating film 31 are provided in this order from the side of the conductive layer 70 between the conductive layer 70 and the semiconductor film 20.

In some embodiments, the tunnel insulating film 31 is in contact with the semiconductor film 20. In some embodiments, the charge storage film 32 is provided between the block insulating film 34 and the tunnel insulating film 31.

In some embodiments, the semiconductor film 20, the memory film 30, and the conductive layer 70 configure (or function as) the memory cell MC. In some embodiments, the memory cell MC may have a vertical transistor structure in which the conductive layer 70 surrounds the circumference of the semiconductor film 20 via the memory film 30.

In some embodiments, in the memory cell MC with the vertical transistor structure, the semiconductor film 20 may function as a channel, and the conductive layer 70 may function as a control gate (or control electrode). In some embodiments, the charge storage film 32 may function as a data storage layer, which stores charges injected from the semiconductor film 20.

The semiconductor memory device according to some embodiments may be a non-volatile semiconductor memory device which is able to electrically and freely perform erasure and writing of data and able to retain the memory content even at the time of power off.

In some embodiments, the memory cell MC may be, for example, a charge trap type memory cell. In some embodiments, the charge storage film 32 may have a great number of trap sites used to trap charges in an insulating film, and may include, for example, a silicon nitride film.

In some embodiments, the tunnel insulating film 31 may serve as a potential barrier when charges are injected from the semiconductor film 20 to the charge storage film 32 or when charges stored in the charge storage film 32 diffuse to the semiconductor film 20. In some embodiments, the tunnel insulating film 31 includes, for example, a silicon oxide film.

In some embodiments, the block insulating film 34 may prevent charges stored in the charge storage film 32 from diffusing to the conductive layer 70. The block insulating film 34 includes, for example, a silicon oxide film. In some embodiments, the block insulating film 34 may restrict back-tunneling of electrons from the conductive layer 70 at the time of an erasing operation.

In some embodiments, the block insulating film is provided between the conductive layer 70 and the insulating layer 40. In some embodiments, the block insulating film 34 is in contact with the lower surface of the insulating layer 40 located just above the conductive layer 70 and in contact with the upper surface of the insulating layer 40 located just below the conductive layer 70.

In some embodiments, the block insulating film 34 located between the conductive layer 70 and the charge storage film 32 and the block insulating film 34 located between the conductive layer 70 and the insulating layer 40 are integrally provided in a successive manner (or in a connected manner).

In some embodiments, a nitride film 60 is provided between the conductive layer 70 and the block insulating film 34. The nitride film 60 may include, for example, a titanium nitride film. In some embodiments, the nitride film 60 may enhance the adhesiveness between the conductive layer 70 and the block insulating film 34. In some embodiments, the nitride film 60 may prevent a metal contained in the conductive layer 70 from diffusing to the side of the block insulating film 34. In some embodiments, the nitride film 60 is in contact with the conductive layer 70 and in contact with the block insulating film 34. In some embodiments, the nitride film 60 is provided in a successive manner along the upper surface, lower surface, and side surface of the conductive layer 70.

In some embodiments, the nitride film 60 and the block insulating film 34 are not provided between a side surface of the insulating layer 40 and the charge storage film 32. In some embodiments, a cover insulating film 33 is provided between a side surface of the insulating layer 40 and the charge storage film 32. In some embodiments, the cover insulating film 33 may be, for example, a silicon oxide film.

As illustrated in FIG. 1, in some embodiments, a drain-side select transistor STD is provided at the upper end portion of the columnar portion CL. In some embodiments, a source-side select transistor STS is provided at the lower end portion of the columnar portion CL. In some embodiments, from among a plurality of conductive layers 70, for example, the lowermost conductive layer 70 may function as a control gate (or control electrode) of the source-side select transistor STS. In some embodiments, from among the plurality of conductive layers 70, for example, the uppermost conductive layer 70 may function as a control gate (control electrode) of the drain-side select transistor STD. In some embodiments, each of the drain-side select transistor STD and the source-side select transistor STS may be a vertical transistor, in which current flows in the stacking direction (or Z-direction) of the stacked body 100, as with the memory cell MC.

In some embodiments, a plurality of memory cells MC are provided between the drain-side select transistor STD and the source-side select transistor STS. In some embodiments, the plurality of memory cells MC, the drain-side select transistor STD, and the source-side select transistor STS may be connected in series via the semiconductor film 20, and configure one memory string (see FIG. 1 and FIG. 3). In some embodiments, such memory strings may be arranged, for example, in a staggered manner along a plane parallel to the X-Y plane, and a plurality of memory cells MC may be three-dimensionally provided in the X-direction, Y-direction, and Z-direction.

As illustrated in FIG. 2, in some embodiments, insulating films 42 are provided at both side walls in the Y-direction of the conductive material LI, which divides the stacked body 100 in the Y-direction. In some embodiments, the insulating film 42 is provided between the stacked body 100 and the conductive material LI (see FIG. 2). In FIG. 1, the insulating film 42 is omitted from illustration.

In some embodiments, the conductive material LI may be a metal material which contains, for example, tungsten as a major component. In some embodiments, the upper end of the conductive material LI is connected to the source layer SL as illustrated in FIG. 1, which is provided above the stacked body 100. In some embodiments, the lower end of the conductive material LI is in contact with the substrate 10, as illustrated in FIG. 2. In some embodiments, the lower end of the semiconductor film 20 is in contact with the substrate 10. In some embodiments, the substrate 10 may be, for example, a silicon substrate in which impurities are doped and which has conductivity. In some embodiments, the lower end of the semiconductor film 20 may be electrically connected to the source layer SL via the substrate 10 and the conductive material LI.

In some embodiments, films configuring the columnar portion CL may be formed in a memory hole formed in the stacked body 100. In some embodiments, the memory hole may be formed by, for example, a reactive ion etching (RIE) method. To increase the memory capacity, in some embodiments, a high-density formation of memory cells may be included. For example, the diameter of the memory hole may be 100 nm or less and the number of stacked conductive layers 70 may be about dozens, so that the memory hole in this case is a microscopic hole with a very high aspect ratio.

Figure 21:
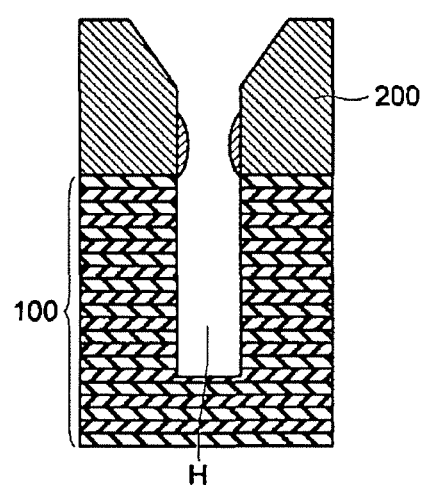
FIG. 21 is a schematic sectional view illustrating an example of shape deterioration of a mask.

In some embodiments, in the RIE technology, as illustrated in FIG. 21, as the processing of a layer to be etched 100 progresses, a corner portion (or shoulder portion) adjacent to an aperture of a mask layer 200 is likely to be formed in a tapered shape by being sputtered by ions. In some embodiments, a sputtered mask material may deposit on the side surface of the aperture.

As capacity enlargement further progresses in the future and the thickness of the layer to be etched 100 increases, in some embodiments, the aspect ratio of the hole H may increase.

Next, a method for forming a memory hole according to some embodiments is described with reference to FIG. 4 to FIG. 10.

Figure 4:
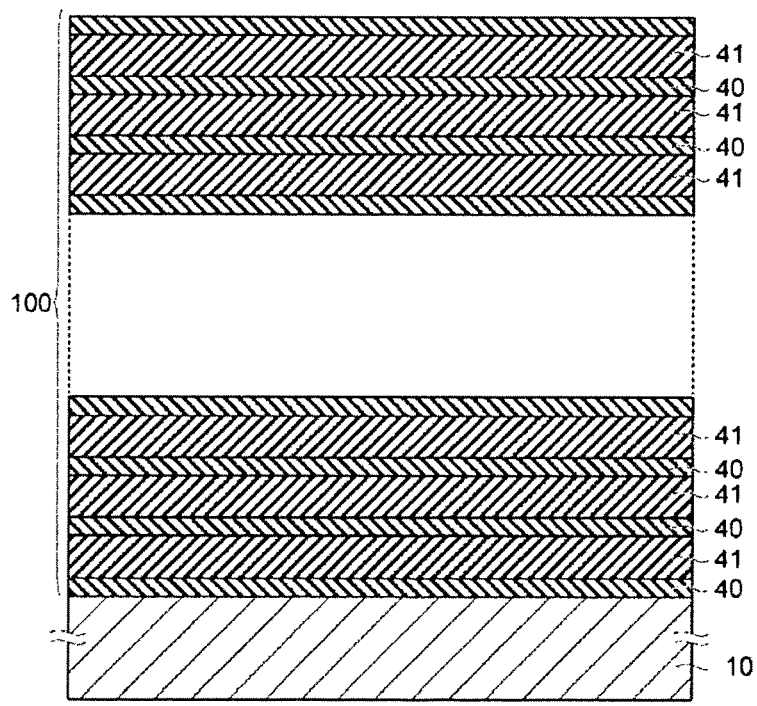
FIG. 4 is a schematic sectional view illustrating a method for manufacturing the semiconductor device according to some embodiments.

As illustrated in FIG. 4, a stacked body 100, which serves as a layer to be etched, is formed on a substrate 10. In some embodiments, the substrate 10 is, for example, a monocrystalline silicon substrate.

In some embodiments, an insulating layer (or second layer) 40 is formed on the principal surface of the substrate 10, and, on the insulating layer 40, a sacrificial layer (or first layer) 41 made from a material different from that of the insulating layer 40 is formed. After that, in some embodiments, a process for alternately stacking the insulating layer 40 and the sacrificial layer 41 in layers is repeated a plurality of times, so that a stacked body 100 including a plurality of insulating layers 40 and a plurality of sacrificial layers 41 are formed on the substrate 10.

In some embodiments, the insulating layer 40 may be, for example, a silicon oxide film ($SiO_2$ film) formed by a chemical vapor deposition (CVD) method. In some embodiments, the sacrificial layer 41 may be, for example, a silicon nitride film (SiN film) formed by the CVD method. In some embodiments, the sacrificial layer 41 may be removed in a later process. In some embodiments, a block insulating film 34, a nitride film 60, and a conductive layer 70 may be formed in a gap (or space) obtained by removing the sacrificial layer 41 (see FIG. 3 and FIG. 4).

In some embodiments, the sacrificial layer 41 may be a layer having a high etching selectivity with respect to the insulating layer 40, but is not limited to a silicon nitride film. For example, the sacrificial layer 41 can be a polycrystalline silicon film formed by the CVD method.

Figure 5:
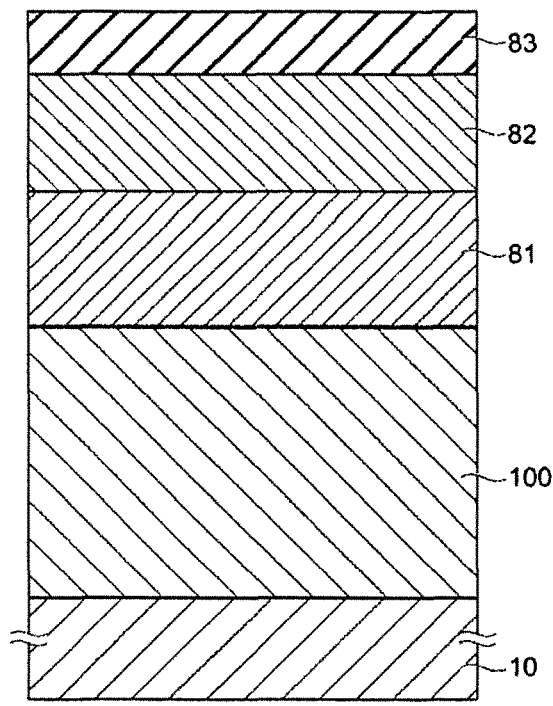
FIG. 5 is a schematic sectional view illustrating the method for manufacturing the semiconductor device according to some embodiments.

In some embodiments, a mask layer 81 is formed on the stacked body 100, as illustrated in FIG. 5. In some embodiments, a first intermediate layer 82 is formed on the mask layer 81. In some embodiments, a resist 83 is formed on the first intermediate layer 82.

In some embodiments, the mask layer 81 may be a layer made from a material different from that of the stacked body 100 (e.g., a material of the insulating layers 40 or a material of the sacrificial layers 41). In some embodiments, the mask layer 81 may contain metal e.g. tungsten (W), boron (B), and carbon (C). In some embodiments, boron or carbon may be present in a disproportionate manner in the mask layer 81. In some embodiments, the density of boron or carbon is not uniform in the mask layer 81. In some embodiments, the composition ratio of tungsten may be higher than the composition ratio of boron and the composition ratio of carbon with respect to the entire mask layer 81. In some embodiments, the composition ratio of tungsten may be higher than the composition ratio of boron or the composition ratio of carbon with respect to the entire mask layer 81. The composition ratio as used herein is expressed by atomic percent.

In some embodiments, with respect to the entire mask layer 81, the composition ratio of tungsten may be higher than 50 atomic percent. For example, with respect to the entire mask layer 81, the composition ratio of tungsten is 60 atomic percent, the composition ratio of boron is 20 atomic percent, and the composition ratio of carbon is 20 atomic percent.

In some embodiments, the mask layer 81 may be formed by, for example, a plasma chemical vapor deposition (CVD) method. In some embodiments, in the CVD, an inorganic gas, such as tungsten hexafluoride ($WF_6$), tungsten(VI) chloride ($WCl_6$), or tungsten hexacarbonyl ($W(CO)_6$), may be used as a tungsten source gas.

In some embodiments, an organic gas can be used as a tungsten source gas. Examples of the organic gas to be used include bis (cyclopentadienyl) tungsten (IV) dihydride ($C_{10}H_{12}W$), cyclopentadienyltungsten(II) tricarbonyl hydride ($C_8H_6O_3W$), bis(tert-butylimino)bis(tert-butylamino)tungsten (($C_4H_9NH)_2W(C_4H_9N)_2$), tetracarbonyl (1,5-cyclooctadiene)tungsten(0) ($C_{12}H_{12}O_4W$), triamminetungsten (IV) tricarbonyl (($NH_3)_3W(CO)_3$), tungsten (0) pentacarbonyl-N-pentylisonitrile (($CO)_5WCN(CH_2)_4CH_3$), bis(isopropylcyclopentadienyl)tungsten(IV) dihydride (($C_5H_4CH(CH_3)_2)_2WH_2$), bis(tert-butylimino)bis(dimethylamino)tungsten(VI) ((($CH_3)_3CN)_2W(N(CH_3)_2)_2$), bis(butylcyclopentadienyl)tungsten(IV) diiodide ($C_{18}H_{26}I_2W$), or bis (cyclopentadienyl)tungsten(IV) dichloride ($C_{10}H_{10}Cl_2W$).

For example, diborane ($B_2H_6$), boron trifluoride ($BF_3$), or pentaborane ($B_5H_9$) can be used as a boron source gas in the CVD used to form the mask layer 81.

For example, propylene ($C_3H_6$), acetylene ($C_2H_2$), ethylene ($C_2H_4$), or methane ($CH_4$) can be used as a carbon source gas in the CVD used to form the mask layer 81.

In some embodiments, the first intermediate layer 82 may be a layer made from a material different from that of the mask layer 81. The first intermediate layer 82 is, for example, an amorphous carbon layer, which contains amorphous carbon as a major component, a boron carbide layer, which contains boron carbide (BC) as a major component, a boron nitride layer, which contains boron nitride (BN) as a major component, a silicon oxide layer, which contains silicon oxide (SiO) as a major component, a silicon nitride layer, which contains silicon nitride (SiN) as a major component, or an amorphous silicon layer, which contains amorphous silicon as a major component. In some embodiments, the first intermediate layer 82 may be formed by, for example, the plasma CVD method.

Figure 6:
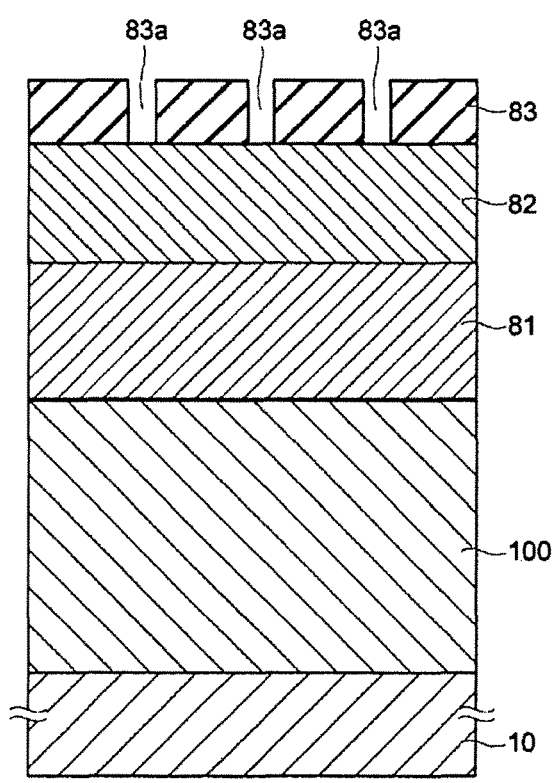
FIG. 6 is a schematic sectional view illustrating the method for manufacturing the semiconductor device according to some embodiments.

In some embodiments, the resist 83 may be formed by, for example, a coating method. In some embodiments, a plurality of holes 83a may be formed in the resist 83 by exposure and development performed on the resist 83, as illustrated in FIG. 6.

Figure 7:
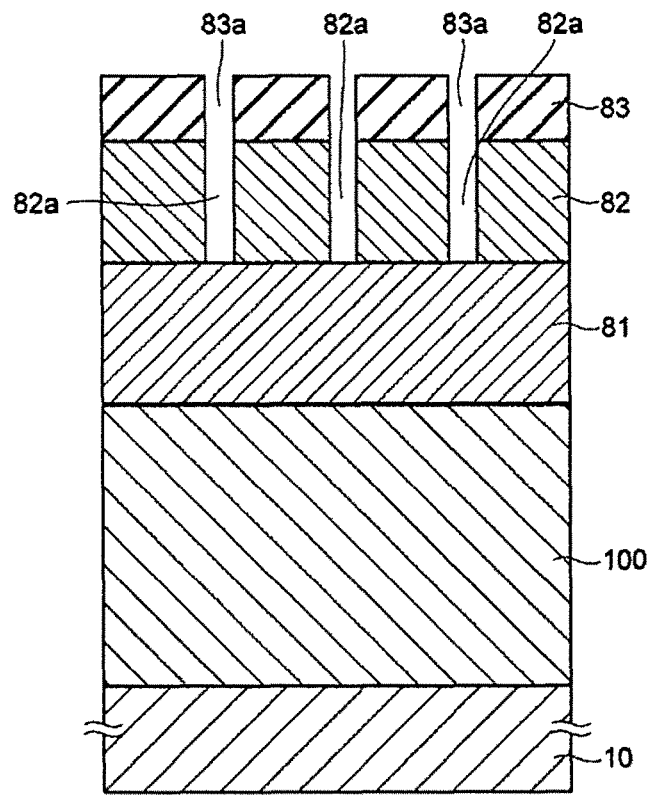
FIG. 7 is a schematic sectional view illustrating the method for manufacturing the semiconductor device according to some embodiments.

In some embodiments, patterning may be performed on the first intermediate layer 82 by the RIE method using, as a mask, the resist 83 with the holes 83a formed therein, as illustrated in FIG. 7. In some embodiments, a plurality of holes 82a are formed in the first intermediate layer 82. For example, in a case where the first intermediate layer 82 is a silicon oxide layer, etching may be performed using a gas containing fluorocarbon and a gas containing oxygen.

Figure 8:
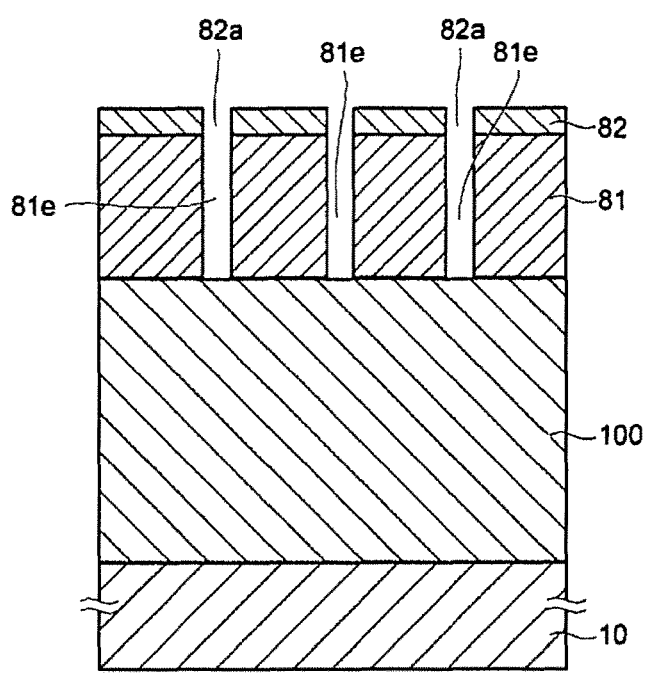
FIG. 8 is a schematic sectional view illustrating the method for manufacturing the semiconductor device according to some embodiments.

In some embodiments, patterning may be performed on the mask layer 81 by the RIE method using, as a mask, the resist 83 and the first intermediate layer 82, as illustrated in FIG. 8. In some embodiments, a plurality of holes 81e are formed in the mask layer 81. For example, a gas containing fluorine may be used as an etching gas at this time. In some embodiments, the resist 83 can disappear during etching of the mask layer 81.

Figure 9:
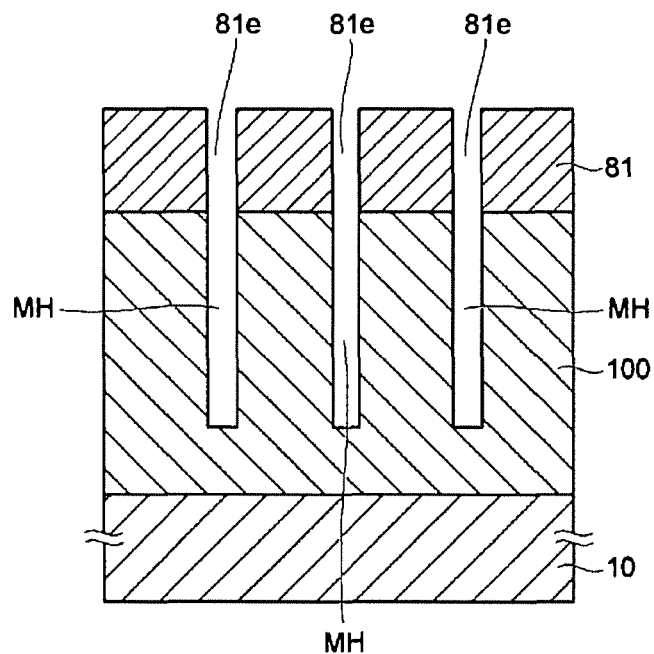
FIG. 9 is a schematic sectional view illustrating the method for manufacturing the semiconductor device according to some embodiments.

Subsequently, in some embodiments, patterning may be performed on the stacked body 100 by the RIE method using the mask layer 81 as a mask, as illustrated in FIG. 9. In some embodiments, a plurality of memory holes MH are formed in the stacked body 100.

In some embodiments, etching may be performed on the stacked body 100 by the RIE method using a gas containing fluorine (for example, a gas containing fluorocarbon or hydrofluorocarbon). In some embodiments, etching may be successively performed on the sacrificial layer 41 and the insulating layer 40 using the same etching gas without switching gases with respect to the sacrificial layer 41 and the insulating layer 40. In some embodiments, the first intermediate layer 82 can disappear during etching of the stacked body 100.

According to some embodiments, a mask layer 81 which contains tungsten, boron, and carbon and in which the composition ratio of tungsten is higher than the composition ratio of boron and the composition ratio of carbon may be used as an etching mask for the stacked body 100 so that such a mask layer 81 is unlikely to cause a shoulder drop (or taper) of the opening end of the hole 81e during etching of the stacked body 100.

Figure 22:
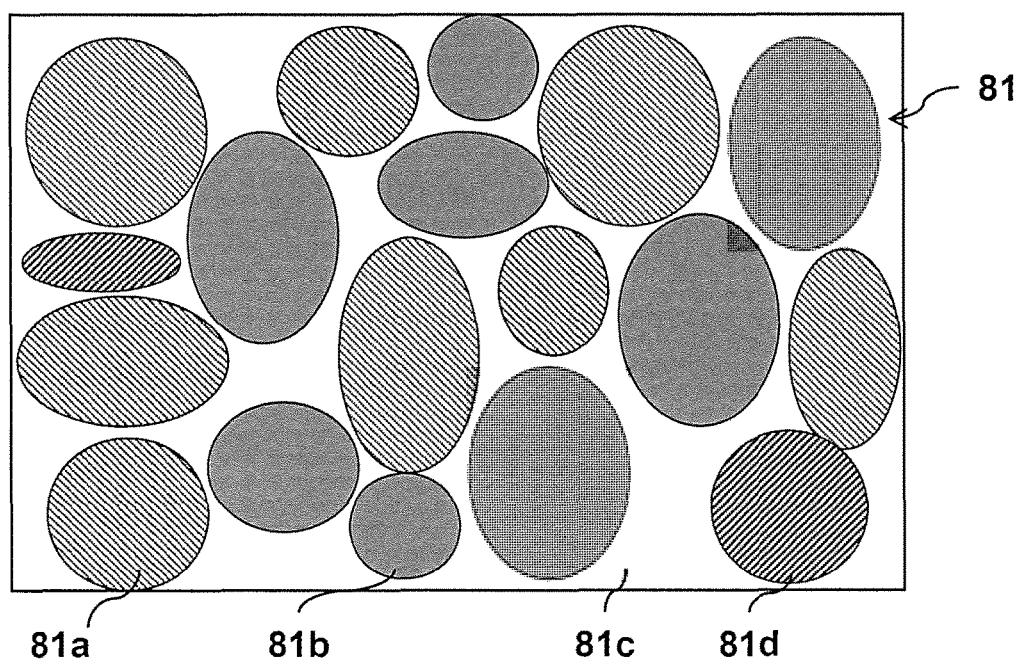
FIG. 22 is a schematic plan view illustrating the method for manufacturing the semiconductor device according to some embodiments.

FIG. 22 illustrates a plan view of the mask layer 81. In some embodiments, the mask layer 81 includes a first region 81a, which may contain tungsten and boron as major components, a second region 81b, which may contain tungsten and carbon as major components, and a third region 81c, which may contain tungsten as a major component. In some embodiments, the mask layer 81 can include a fourth region 81d, which may contain boron and carbon as major components. In some embodiments, in the film surface of the mask layer 81, boron or carbon is not uniformly present. In some embodiments, the mask layer 81 has regions in which the density of boron or carbon is different. In some embodiments, the region 81a differs in the density of born from the regions 81b and 81c. In some embodiments, the region 81b differs in the density of carbon from the regions 81a and 81c. The result of the experiment showed that, in a mask layer having regions in which the density of boron or the density of carbon was different, the etching rate caused by ions incident in a direction of 45° was low. In some embodiments, the mask layer 81 can have regions in which tungsten is non-uniformly present and the density of tungsten differs.

Figure 23:
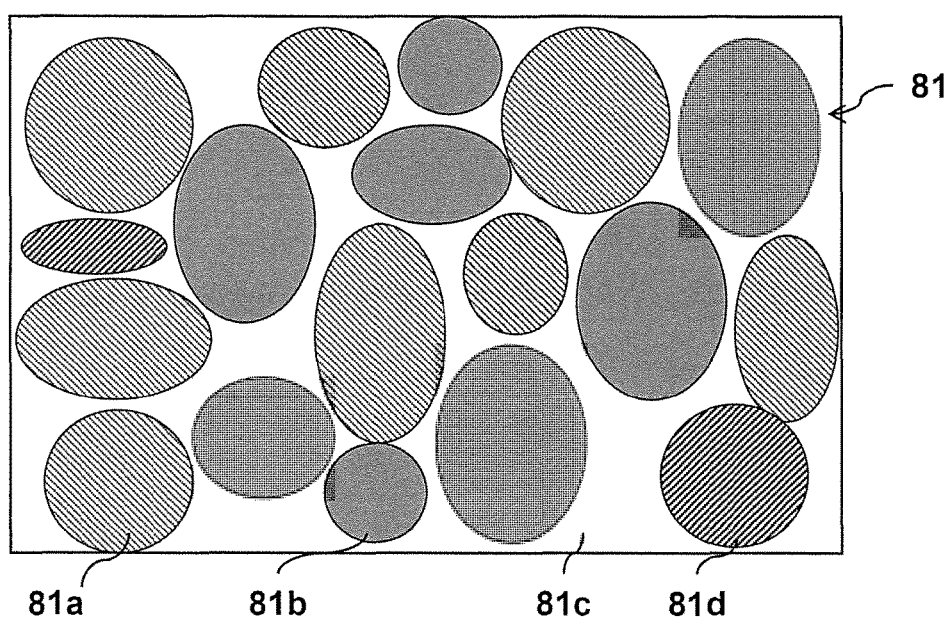
FIG. 23 is a schematic sectional view illustrating the method for manufacturing the semiconductor device according to some embodiments.
Figure 23:
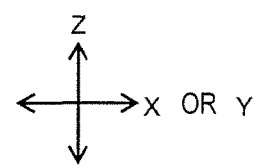

Even in a case where boron and carbon are non-uniformly present in this way, in some embodiments, the etching rate is low and the mask layer 81 is able to be used as a mask layer for etching. In some embodiments, to perform patterning for more microstructured processing, the sizes of the regions 81a and 81b can be decreased, so that the influence of the disproportionate presence of constituent elements on the shape of processing can be reduced. For example, the size of each of the regions 81a and 81b is 10 nm or more to 50 nm or less. In some embodiments, the size of each of the regions 81*a* and 81*b* may be the longest direct distance obtainable in that region in a direction parallel to the film surface of the mask layer 81. In some embodiments, even if an element other than tungsten and carbon, for example, boron, is mixed in the region 81*b*, the mask layer 81 may function as a hard mask. In some embodiments, FIG. 22 is a plan view schematically illustrating the mask layer 81, and the mask layer 81 is not limited to a configuration example in which the regions 81*b* and 81*c* have a circular or ellipsoidal shape as illustrated in FIG. 22. In some embodiments, the density of boron or carbon may be disproportionate in a plane (e.g., X-Y plane) parallel to the film surface. In some embodiments, the density of boron or carbon may be disproportionate in a plane (e.g., X-Z plane or Y-Z plane) parallel to the film thickness direction, as illustrated in FIG. 23.

In some embodiments, in the RIE, the etching rate may depend on the direction (or angle) of incidence of ions. For example, etching using ions incident from a direction inclined 45° (or 45° direction) with respect to a direction perpendicular to the surface of the film (or 0° direction) may have a tendency to exhibit a higher etching rate than in the case of vertical incidence, so that a shoulder drop (or taper) of the mask layer such as that illustrated in FIG. 21 is apt to occur. Accordingly, to reduce a shoulder drop (taper) of the mask layer and the resultant deterioration of the hole shape, a mask layer having high etching resistance to ions incident from the 45° direction is effective.

In some embodiments, using a mask layer which contains tungsten, boron, or carbon and in which the density of boron or carbon is disproportionate, such as that illustrated in FIG. 22, may prevent a shoulder drop (or taper) of the mask layer 81. In some embodiments, setting the composition ratio of tungsten higher than the composition ratio of boron and the composition ratio of carbon in the entire mask layer may prevent such a shoulder drop.

Accordingly, according to some embodiments, the hole 81*e* can be prevented, for example, from being blocked, and etching of the stacked body 100 can be advanced in a direction approximately perpendicular to the principal surface of the substrate 10, so that a memory hole MH having a side wall in a straight shape in which the variation in diameter in the depth direction is reduced can be easily formed. For example, the appropriately shaped memory hole MH may reduce the variation in memory cell characteristics in the stacking direction.

In some embodiments, a tungsten film may be apt to crystallize. In some embodiments, the crystallized film has a great number of crystal grain boundaries. In some embodiments, if such a W film is used as the mask layer 81, etching may sometimes progress along the crystal grain boundary. In some embodiments, since a difference in etching rate occurs depending on the crystal orientation and a variation may occur in etching, microscopic irregularities in which the shapes of crystal grain boundaries are reflected are likely to appear on the side surface of the hole 81*e*. This may hinder microscopic patterning.

The above-described mask layer 81 according to some embodiments is a substantially amorphous material. The term "substantially amorphous material" refers to a non-crystalline material or a microcrystalline material with a crystal grain size of less than 100 nm. In some embodiments, the substantially amorphous material may be a material in which a diffusive (or broad) diffraction intensity, in other words, a halo peak, may be observed in a diffraction measurement typified by electron diffraction, such as reflection high energy electron diffraction (RHEED), or X-ray diffraction. In some embodiments, the substantially amorphous material can be a material in which a diffraction line from an intermetallic compound microcrystal caused by the incompleteness of an amorphous material appears. In some embodiments, not the entirety of the mask layer 81 is an amorphous material, and the mask layer 81 can have a structure in which a part of the thin film of a crystalline material is amorphous.

In some embodiments, the mask layer 81 may be formed by the CVD method in a condition in which the wafer is heated, and the wafer temperature at that time may be 1,000° C. or less. In some embodiments, with respect to the mask layer 81, after the film formation process, the film can be modified by thermal and electromagnetic wave treatment, such as general furnace anneal, rapid thermal anneal (RTA), flash lamp anneal (FLA), microwave anneal, ultraviolet (UV) irradiation, or electron beam (EB) irradiation. In some embodiments, setting the wafer temperature at the time of thermal treatment during film formation or after film formation by the plasma CVD method to a high temperature may cause the disproportionate presence of boron and carbon in the mask layer 81 to easily occur. In some embodiments, increasing the amount of plasma supply power during film formation in the plasma CVD may cause the disproportionate presence of boron and carbon to easily occur.

In some embodiments, the mask layer 81 can be formed by the sputtering method. In some embodiments, with regard to methods for forming the mask layer 81, the CVD method may be higher in film formation speed and superior in mass productivity than the sputtering method. In some embodiments, in the case of the formation using the sputtering method, as in the CVD method, setting the wafer temperature at the time of thermal treatment during film formation or after film formation to a high temperature may cause the disproportionate presence of tungsten, boron, and carbon in the mask layer 81 to easily occur.

In some embodiments, tungsten, which is a metal contained as a major component in the mask layer 81, may belong to a group in which the sputtering rate by ions is lower from among metals that are commonly used for the semiconductor process. Besides tungsten, in some embodiments, tantalum, zirconium, hafnium, molybdenum, niobium, ruthenium, osmium, rhenium, or iridium can be used as a metal contained as a major component in the mask layer 81.

In some embodiments, the mask layer 81 may contain a) one of metals including tungsten, tantalum, zirconium, hafnium, molybdenum, niobium, ruthenium, osmium, rhenium, and iridium, b) boron, and c) carbon. In some embodiments, the mask layer 81 may have regions with respective different densities of boron. In some embodiments, the mask layer 81 may have regions with respective different densities of carbon.

In some embodiments, with regard to a mask layer 81 which contains one of the above metals other than tungsten at a composition ratio higher than those of boron and carbon, a similar result to that described above can also be obtained. In some embodiments, a mask layer 81 which contains a) one of metals including tungsten, tantalum, zirconium, hafnium, molybdenum, niobium, ruthenium, osmium, rhenium, and iridium, b) boron, and c) carbon and which has regions with respective different densities of boron or carbon may be low in 45° etching rate and is unlikely to cause a shoulder drop.

In some embodiments, from among the above-mentioned metals, tungsten, tantalum, zirconium, hafnium, molybdenum, and niobium are more desirable than the other metals because they have track records of application in the semiconductor process and are low in possibility of fatal pollution risk.

Among them, in some embodiments, tungsten can be used as the conductive layer (or control electrode) 70 of the memory cell MC or the conductive material LI in view of its low resistance and high melting point. In some embodiments, selecting tungsten as a metal to be contained in the mask layer 81 can facilitate process control or management, so that an improvement in mass productivity can be expected.

In some embodiments, even if an element or elements arising from a source gas used in the CVD at the time of formation of the mask layer 81 are contained in the mask layer 81 besides the above-mentioned metal, boron, and carbon, those elements may be extremely small in amount and, therefore, do not likely affect the characteristics of the mask layer 81.

In some embodiments, in a case where the amount of consumption of the resist 83 is large as compared with an etching gas used to process the mask layer 81, the film thickness of the resist 83 may be increased (although the increase in film thickness of the resist 83 may have a limitation due to the resolution limit of lithography). Therefore, in some embodiments, a first intermediate layer 82 can be formed between the mask layer 81 and the resist 83 and the first intermediate layer 82 can be used as a processing mask for the mask layer 81.

Figure 20:
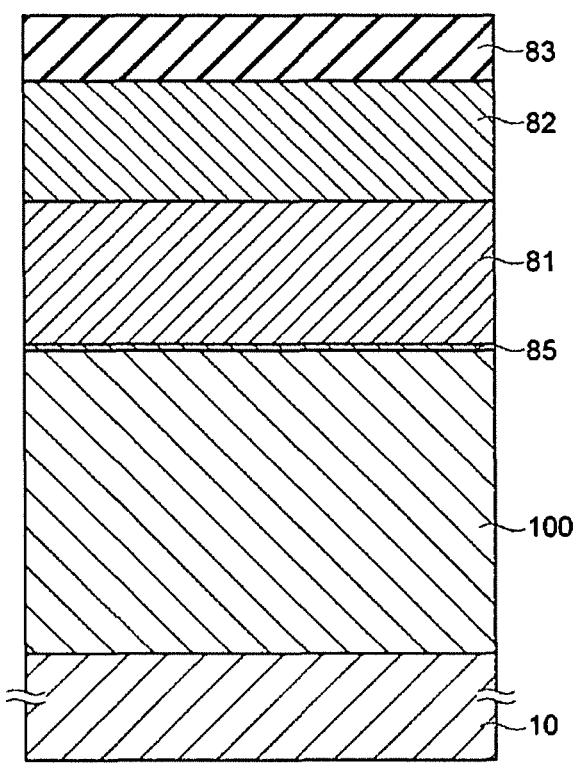
FIG. 20 is a schematic sectional view illustrating the method for manufacturing the semiconductor device according to some embodiments.

In some embodiments, as illustrated in FIG. 20, if a film 85 containing a metal nitride is formed between the stacked body 100 and the mask layer 81, the adhesiveness between the stacked body 100 and the mask layer 81 can be enhanced. In some embodiments, a nitride film of the same metal (for example, tungsten) as the metal (for example, tungsten) contained in the mask layer 81 can be used as the film 85.

In some embodiments, if nitrogen is further contained in the mask layer 81 itself, the adhesiveness between the mask layer 81 and the stacked body 100 can be enhanced.

In some embodiments, the insulating layer 40 of the stacked body 100 may be a silicon oxide film and the sacrificial layer 41 may be a silicon nitride film, each being a compound containing silicon. Therefore, in some embodiments, if silicon is further contained in the mask layer 81, the adhesiveness between the mask layer 81 and the stacked body 100 can also be enhanced.

Figure 18:
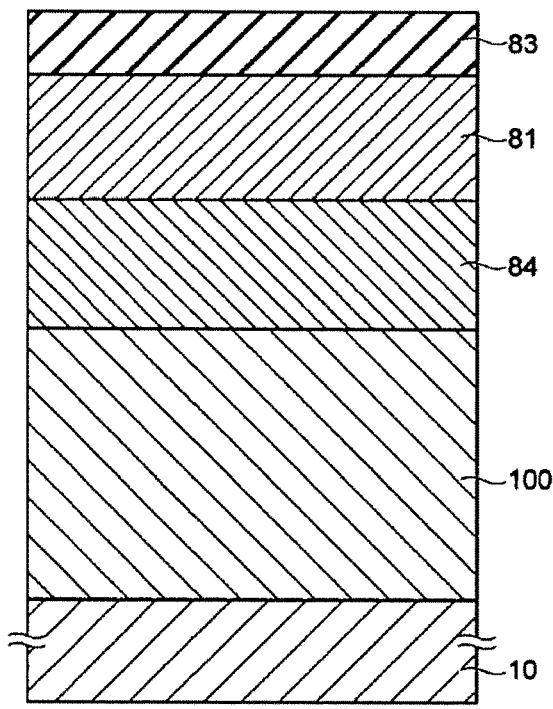
FIG. 18 is a schematic sectional view illustrating the method for manufacturing the semiconductor device according to some embodiments.

In some embodiments, as illustrated in FIG. 18, a second intermediate layer 84 can be formed between the stacked body 100 and the mask layer 81. In some embodiments, the second intermediate layer 84 may be a layer made from a material different from those of the stacked body 100 (e.g., the insulating layer 40 or the sacrificial layer 41) and the mask layer 81. In some embodiments, the second intermediate layer 84 may be, for example, an amorphous carbon layer, which contains amorphous carbon as a major component, a boron carbide layer, which contains boron carbide (BC) as a major component, a boron nitride layer, which contains boron nitride (BN) as a major component, or an amorphous silicon layer, which contains amorphous silicon as a major component. In some embodiments, the second intermediate layer 84 may be formed by, for example, the plasma CVD method.

In some embodiments, in a case where the thickness as an etching mask for the stacked body 100 is not satisfied only by the mask layer 81, the second intermediate layer 84 can function as a mask used to process the stacked body 100. If an increase in film stress due to the increase in film thickness of the mask layer 81, which contains a metal, is desired, it may sometimes become difficult to increase the film thickness of the mask layer 81. In some embodiments, even if the film thickness of the mask layer 81 itself is not increased, the second intermediate layer 84, which contains no metal, is able to supplement the insufficient thickness of the mask layer 81 as a mask used to process the stacked body 100.

In some embodiments, if the second intermediate layer 84 formed between the stacked body 100 and the mask layer 81 can be readily separated from the stacked body 100, the mask layer 81, which is located on the second intermediate layer 84, can be lifted off and can be easily removed from the stacked body 100.

Figure 19:
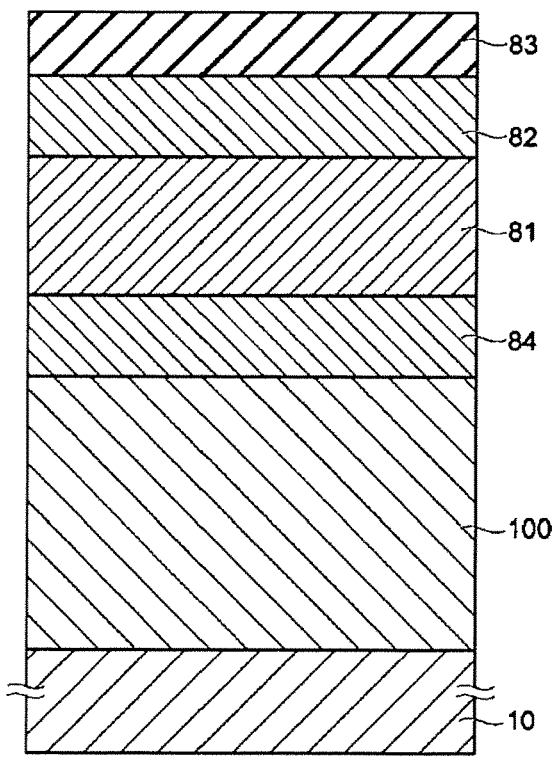
FIG. 19 is a schematic sectional view illustrating the method for manufacturing the semiconductor device according to some embodiments.

In some embodiments, as illustrated in FIG. 19, the second intermediate layer 84 can be formed between the stacked body 100 and the mask layer 81, and the first intermediate layer 82 can be formed between the mask layer 81 and the resist 83.

Figure 10:
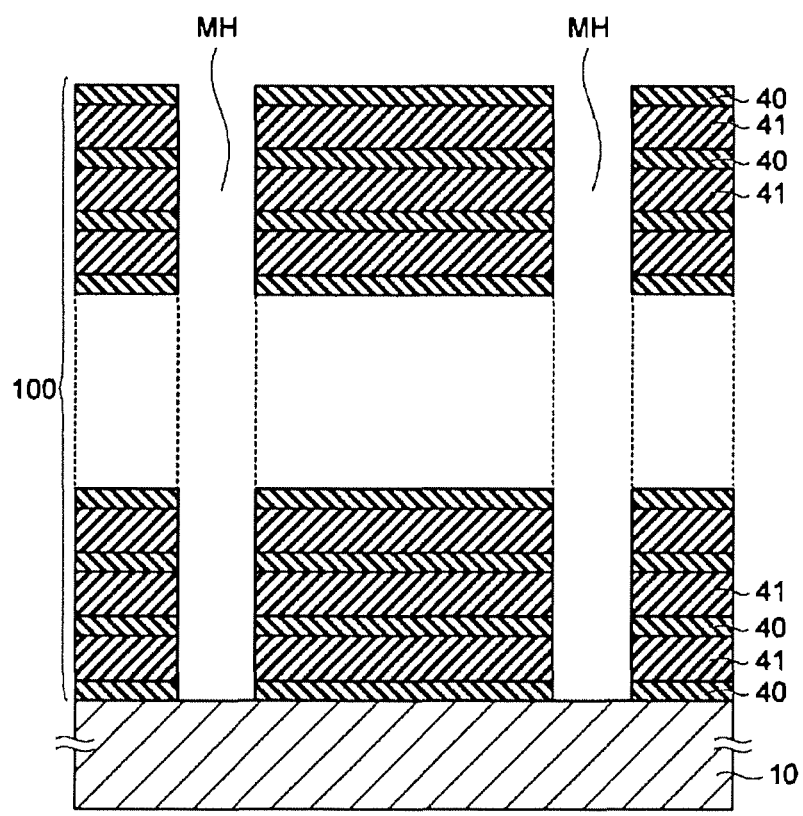
FIG. 10 is a schematic sectional view illustrating the method for manufacturing the semiconductor device according to some embodiments.

In some embodiments, according to the dry etching (RIE) using the above-described mask layer 81, as illustrated in FIG. 10, a plurality of memory holes MH may be formed in the stacked body 100. In some embodiments, the memory hole MH can extend in the stacking direction (or Z-direction) of the stacked body 100 and penetrate through the stacked body 100, thus reaching the substrate 10.

Figure 11:
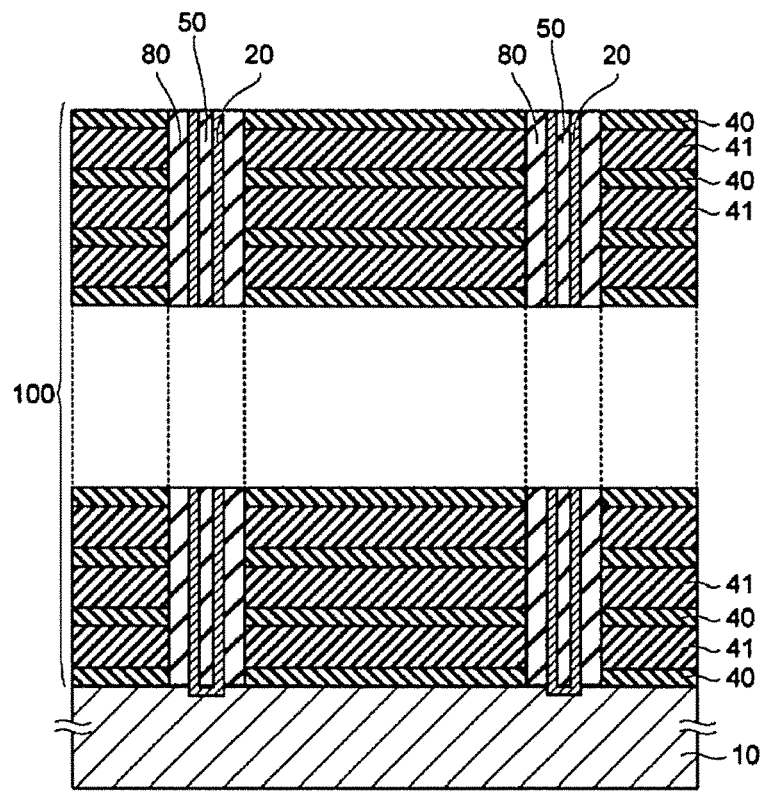
FIG. 11 is a schematic sectional view illustrating the method for manufacturing the semiconductor device according to some embodiments.
Figure 12:
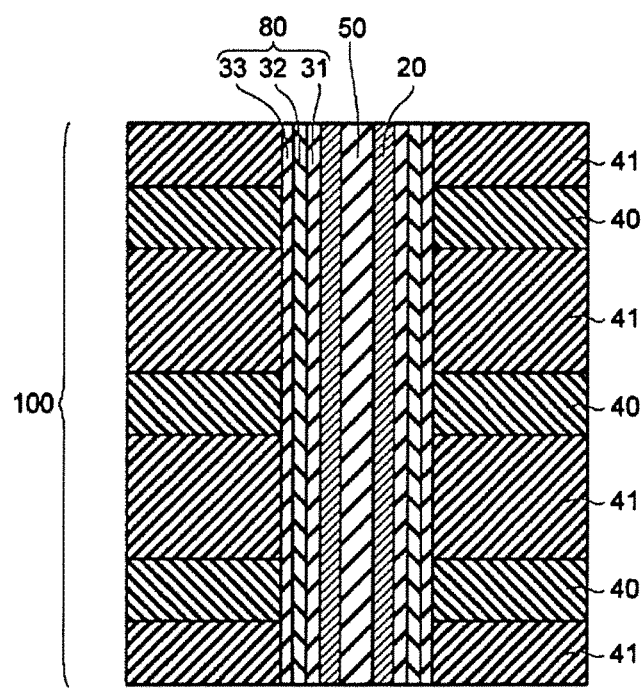
FIG. 12 is a schematic sectional view illustrating the method for manufacturing the semiconductor device according to some embodiments.

In some embodiments, as illustrated in FIG. 11 and FIG. 12, which is an enlarged view of a portion illustrated in FIG. 11, a stacked film 80, a semiconductor film 20, and a core film 50 are formed inside the memory hole MH. In some embodiments, as illustrated in FIG. 12, the stacked film 80 includes a cover insulating film 33, a charge storage film 32, and a tunnel insulating film 31.

First, for example, a silicon oxide film ($SiO_2$ film) may be formed as the cover insulating film 33 on the side surface of the memory hole MH by an atomic layer deposition (ALD) method. In some embodiments, the cover insulating film 33 may be formed on the bottom of the memory hole MH.

For example, a silicon nitride film (SiN film) is formed as the charge storage film 32 at the inner side of the cover insulating film 33 by the ALD method. In some embodiments, the charge storage film 32 may be a film capable of trapping charges. In some embodiments, the charge storage film 32 can be, for example, a hafnium oxide film ($HfO_x$ film), an aluminum oxide film ($AlO_x$ film), or an aluminum nitride film (AlN film). In some embodiments, the charge storage film 32 can be a stacked film including at least two of a silicon nitride film, a hafnium oxide film, an aluminum oxide film, or an aluminum nitride film.

For example, a silicon oxide film ($SiO_2$ film) can be formed as the tunnel insulating film 31 at the inner side of the charge storage film 32 by the ALD method.

In some embodiments, a gap may be left (or defined) at the inner side of the stacked film 80, and a part of the stacked film 80, which is deposited at the bottom of the memory hole MH below the gap, may be removed by, for example, the RIE method. After that, in some embodiments, the semiconductor film 20 may be formed on the side surface of the tunnel insulating film 31.

In some embodiments, as illustrated in FIG. 11, the semiconductor film 20 may be formed at the bottom of the memory hole MH and may be in contact with the substrate 10. For example, a silicon film may be formed as the semiconductor film 20 by the CVD method.

In some embodiments, a gap may be left (or defined) at the inner side of the semiconductor film 20, and the gap is filled with, for example, a silicon oxide film (SiO$_2$ film) as the core film 50.

Figure 13:
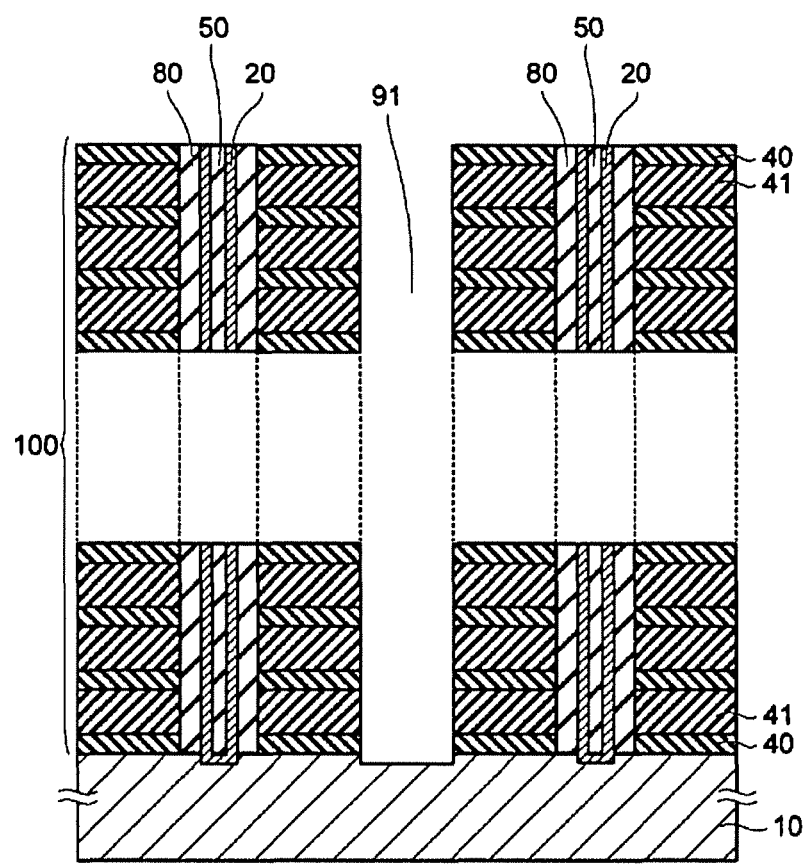
FIG. 13 is a schematic sectional view illustrating the method for manufacturing the semiconductor device according to some embodiments.

Next, in some embodiments, as illustrated in FIG. 13, a groove 91 is formed in the stacked body 100. In some embodiments, the groove 91 can be formed by the RIE method using the mask layer 81, which is similar to that used to form the memory hole MH. In some embodiments, a groove which is not a hole may be formed in the mask layer 81, so that the groove can be formed in the stacked body 100 by the RIE method using the mask layer 81. At this time, in some embodiments, a shoulder drop (or taper) of the mask layer 81 can be prevented.

In some embodiments, the groove 91 may extend in the stacking direction (or Z-direction) of the stacked body 100 and penetrates through the stacked body 100, thus reaching the substrate 10. In some embodiments, the groove 91 may extend in the sheet depth direction (or X-direction) and separate the stacked body 100 in the Y-direction.

Figure 14:
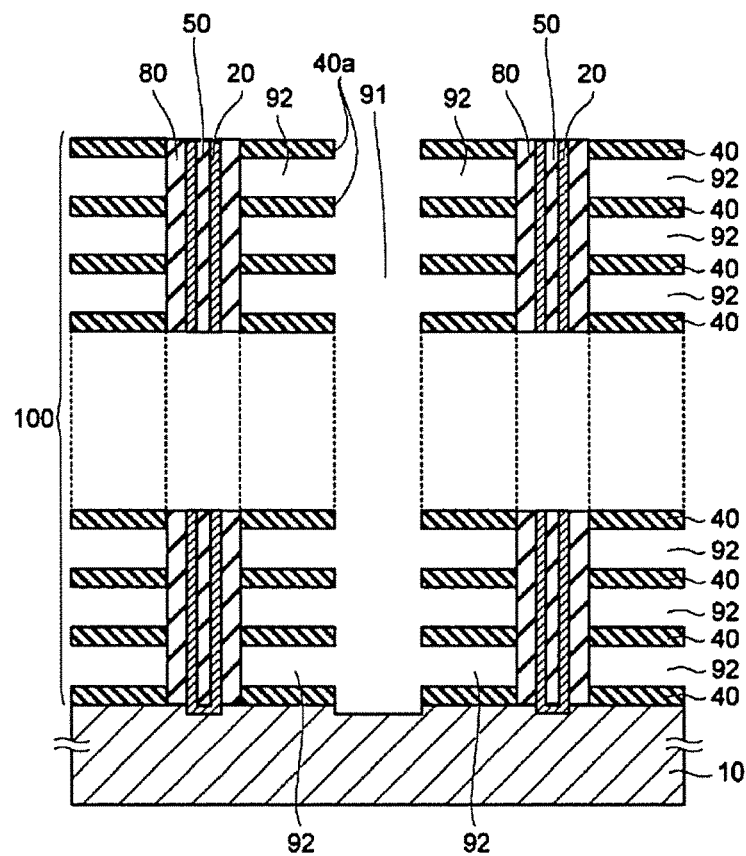
FIG. 14 is a schematic sectional view illustrating the method for manufacturing the semiconductor device according to some embodiments.

Next, in some embodiments, the sacrificial layers 41 may be removed by wet etching using, for example, heat phosphoric acid supplied through the groove 91. In some embodiments, with the removal of the sacrificial layers 41, as illustrated in FIG. 14, gaps (or spaces) 92 are formed between the insulating layers 40. In some embodiments, the cover insulating film 33 can protect the charge storage film 32 during the etching.

Figure 15:
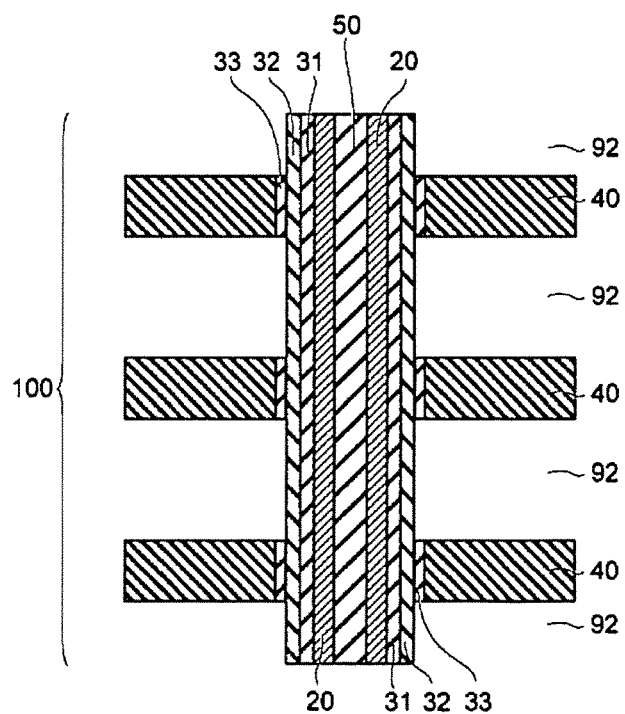
FIG. 15 is a schematic sectional view illustrating the method for manufacturing the semiconductor device according to some embodiments.

In some embodiments, a part of the cover insulating film 33 can be removed by wet etching. In some embodiments, portions of the cover insulating film 33 facing the gaps 92 are removed as illustrated in the enlarged view of FIG. 15, so that the charge storage film 32 is exposed at the gaps 92.

In some embodiments, performing control to set the etching rate used to remove the cover insulating film 33 lower than the etching rate used to remove the sacrificial layers 41 may prevent etching damage to the charge storage film 32.

Figure 16:
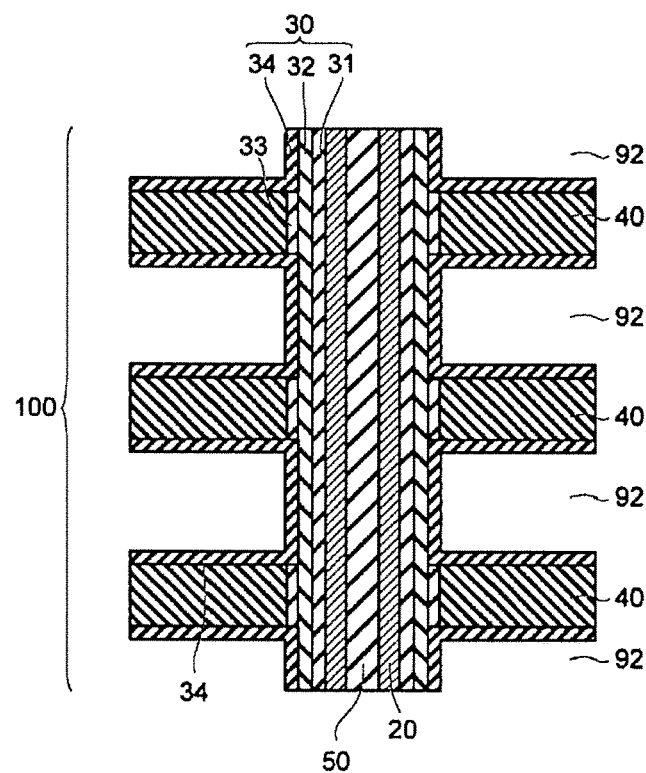
FIG. 16 is a schematic sectional view illustrating the method for manufacturing the semiconductor device according to some embodiments.

Next, in some embodiments, as illustrated in FIG. 16, a block insulating film 34 is formed on the inner wall of the gap 92. For example, a silicon oxide film (SiO$_2$ film) may be formed as the block insulating film 34 by the ALD method. In some embodiments, the block insulating film 34 can be a stacked film configured with a silicon oxide film and a silicon nitride film. In some embodiments, the block insulating film 34 can be a high-k film, such as an aluminum oxide film (AlO$_x$ film), a hafnium oxide film (HfO$_x$ film), or a lanthanum aluminum oxide film (LaAlO$_x$ film). In some embodiments, the block insulating film 34 can be a stacked film configured with the above high-k film and a silicon oxide film. In some embodiments, the above high-k film can be used as the tunnel insulating film 31.

In some embodiments, the block insulating film 34 is formed in a conformal manner along the upper surface and lower surface of the insulating layer 40 and the charge storage film 32, which are exposed at the gap 92.

Figure 17:
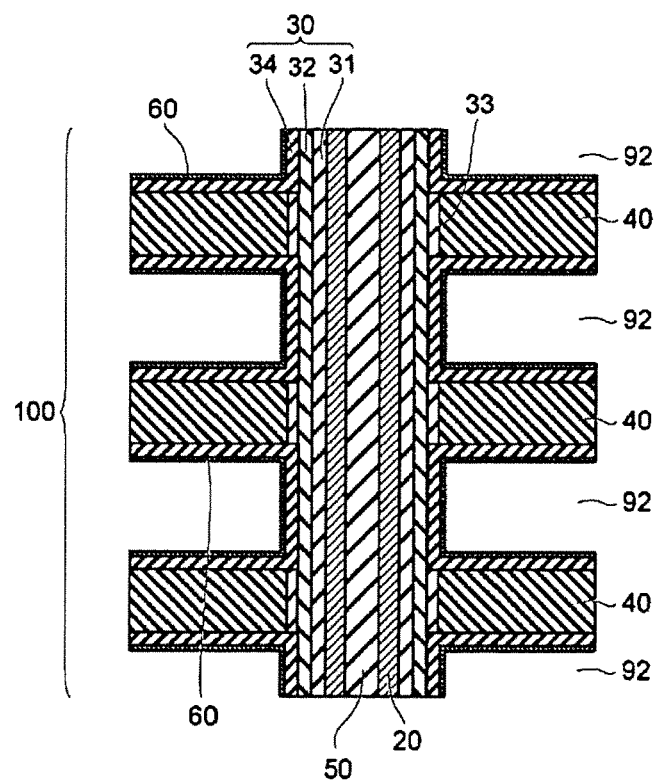
FIG. 17 is a schematic sectional view illustrating the method for manufacturing the semiconductor device according to some embodiments.

Next, in some embodiments, as illustrated in FIG. 17, for example, a titanium nitride film (TiN film) 60 may be formed at the inner side of the block insulating film 34 by the CVD method. In some embodiments, the titanium nitride film 60 is formed in a conformal manner along the block insulating film 34.

In some embodiments, a gap 92 is left (or defined) at the inner side of the titanium nitride film 60. In some embodiments, a conductive layer 70 is formed inside the gap 92 as illustrated in FIG. 3.

In some embodiments, the gap 92 may be filled with, for example, a tungsten layer as the conductive layer 70 by the CVD method using tungsten fluoride (WF$_6$) gas. In some embodiments, the gap 92 may be filled with, for example, a molybdenum layer as the conductive layer 70 by the CVD method using molybdenum fluoride (WMo$_6$) gas.

In some embodiments, interposing the titanium nitride film 60 between the block insulating film 34 and the conductive layer 70 can enhance the adhesiveness between the conductive layer 70 and the titanium nitride film 60 as compared with the case of directly forming the conductive layer 70 on the block insulating film 34.

In some embodiments, the titanium nitride film 60 can function as a barrier layer to prevent a metal (e.g., tungsten or molybdenum) contained in the conductive layer 70 from diffusing to the side of the memory film 30.

Besides a titanium nitride film, for example, a nitride film, such as a tantalum nitride film (TaN film), a tantalum aluminum nitride film (TaAlN film), or a titanium silicon nitride film (TiSiN film) can be interposed between the block insulating film 34 and the conductive layer 70.

In some embodiments, a source gas for the conductive layer 70 may enter the gap 92 through the groove 91 illustrated in FIG. 14. At that time, in some embodiments, a material film (e.g., metal film) for the conductive layer 70 may be deposited and formed on the side surface 40a of the insulating layer 40, which is exposed at the groove 91. After that, in some embodiments, the metal film on the side surface 40a of the insulating layer 40 may be removed, and the short circuit between the conductive layers 70 at different layers connected through the metal film may be broken.

In some embodiments, the titanium nitride film 60, which is formed in a conformal manner along the inner wall of the gap 92 before formation of the conductive layer 70, may be formed on the side surface 40a of the insulating layer 40, and the titanium nitride films 60 at different layers may be connected to each other via the portion thereof formed on the side surface 40a of the insulating layer 40. In some embodiments, the conductive layer 70, which is formed after the titanium nitride film 60, may be in contact with the titanium nitride film 60, such that the conductive layers 70 at different layers are short-circuited via the titanium nitride film 60, which is conductive. Therefore, in some embodiments, the titanium nitride film 60 formed on the side surface 40a of the insulating layer 40 may be removed, so that the connection between the titanium nitride films 60 in the vertical direction (or stacking direction) is removed, thereby breaking the short circuit between the conductive layers 70 at different layers connected via the titanium nitride film 60.

After that, in some embodiments, as illustrated in FIG. 2, a conductive material LI is formed inside the groove 91 (see FIG. 13) via an insulating film 42 (see FIG. 2). In some embodiments, the insulating film 42 is formed in a conformal manner on the side surface and bottom of the groove 91. In some embodiments, the insulating film 42 at the bottom of the groove 91 may be removed by, for example, the RIE method, so that the substrate 10 is exposed at the bottom of the groove 91. After that, in some embodiments, the conductive material LI is formed at the inner side of the insulating film 42 inside the groove 91, and the lower end of the conductive material LI is in contact with the substrate 10 (see FIG. 2). After that, for example, bit lines BL and a source layer SL illustrated in FIG. 1 are formed.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A method for manufacturing a semiconductor device, the method comprising:
   forming a mask layer including a) one metal from tungsten, tantalum, zirconium, hafnium, molybdenum, niobium, ruthenium, osmium, rhenium, and iridium, b) boron, and c) carbon on a layer to be etched;
   patterning the mask layer; and
   forming a hole or a groove in the layer to be etched by performing dry etching on the layer to be etched using the patterned mask layer,
   wherein the mask layer includes a first region and a second region,
   wherein the first region includes boron and the second region includes boron such that a density of boron in the second region is different from a density of boron in the first region, or
   the first region includes carbon and the second region includes carbon such that a density of carbon in the second region is different from a density of carbon in the first region.

2. The method according to claim 1, wherein the first region and the second region are included in a plane parallel to a film surface of the mask layer.

3. The method according to claim 1, wherein the first region and the second region are included in a plane parallel to a film thickness of the mask layer.

4. The method according to claim 1, wherein the mask layer further includes nitrogen.

5. The method according to claim 1, wherein the mask layer further includes silicon.

6. The method according to claim 1, wherein the layer to be etched includes silicon, and
   wherein etching is performed on the layer to be etched using a gas including fluorine.

7. The method according to claim 1, wherein the layer to be etched is a stacked body including a plurality of first layers and a plurality of second layers, each of the second layers being made from a material different from that of the first layers and being provided between the first layers.

8. The method according to claim 7, wherein the first layers include a silicon nitride film, and the second layers include a silicon oxide film.

9. The method according to claim 7, further comprising:
   removing the first layers and forming gaps between the second layers by performing etching through the hole or the groove.

10. The method according to claim 9, further comprising:
    forming conductive layers in the gaps.

11. The method according to claim 1, further comprising:
    forming a film including a metal nitride provided between the layer to be etched and the mask layer.

12. The method according to claim 1, further comprising:
    forming a first layer on the mask layer, the first layer being made from a material different from that of the mask layer,
    wherein the mask layer is patterned by performing etching using the first layer as a mask.

13. The method according to claim 12, wherein the first layer includes as a major component a carbon layer, boron carbide, boron nitride, silicon oxide, silicon nitride, or amorphous silicon.

14. The method according to claim 12, further comprising forming a second intermediate layer provided between the layer to be etched and the mask layer and made from a material different from those of the layer to be etched and the mask layer.

15. The method according to claim 14, wherein the second intermediate layer includes as a major component a carbon layer, boron carbide, boron nitride, or amorphous silicon.

16. The method according to claim 1, wherein the mask layer is formed by a chemical vapor deposition.

17. An etching mask provided on a layer to be etched, the layer to be etched made of a material including silicon, the etching mask comprising:
    a) one metal from tungsten, tantalum, zirconium, hafnium, molybdenum, niobium, ruthenium, osmium, rhenium, and iridium, b) boron, and c) carbon on the layer to be etched;
    wherein the etching mask includes a first region and a second region,
    wherein the first region includes boron and the second region includes boron such that a density of boron in the second region is different from a density of boron in the first region, or
    wherein the first region includes carbon and the second region includes carbon such that a density of carbon in the second region is different from a density of carbon in the first region.

18. The etching mask according to claim 17, wherein the layer to be etched is a stacked body including a plurality of first layers and a plurality of second layers, each of the second layers being made from a material different from that of the first layers and being provided between the first layers.

19. The etching mask according to claim 18, wherein the first layers include a silicon nitride film, and the second layers include a silicon oxide film.

20. The etching mask according to claim 18, wherein the etching mask is formed on a film including a metal nitride provided on the stacked body.

* * * * *